United States Patent
Jeon et al.

(10) Patent No.: US 11,088,236 B2
(45) Date of Patent: Aug. 10, 2021

(54) DISPLAY APPARATUS

(71) Applicant: SAMSUNG DISPLAY CO., LTD., Yongin-si (KR)

(72) Inventors: Myoung-Ha Jeon, Yongin-si (KR); Kichang Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 25 days.

(21) Appl. No.: 16/507,202

(22) Filed: Jul. 10, 2019

(65) Prior Publication Data

US 2020/0098842 A1    Mar. 26, 2020

(30) Foreign Application Priority Data

Sep. 21, 2018  (KR) .......................... 10-2018-0113863

(51) Int. Cl.
  *H01L 27/32*   (2006.01)
  *H01L 51/52*   (2006.01)
  *H01L 51/00*   (2006.01)

(52) U.S. Cl.
  CPC ...... *H01L 27/3272* (2013.01); *H01L 27/3246* (2013.01); *H01L 27/3248* (2013.01); *H01L 27/3258* (2013.01); *H01L 27/3276* (2013.01); *H01L 51/0097* (2013.01); *H01L 51/5253* (2013.01); *H01L 2251/5338* (2013.01)

(58) Field of Classification Search
  None
  See application file for complete search history.

(56) References Cited

U.S. PATENT DOCUMENTS

| | | | |
|---|---|---|---|
| 8,237,165 B2 | 8/2012 | Kim et al. | |
| 9,029,846 B2 | 5/2015 | Song et al. | |
| 9,553,275 B2* | 1/2017 | Kim | ............... H01L 51/5253 |
| 10,748,976 B2* | 8/2020 | Nishimura | .......... H01L 23/4985 |
| 2019/0050083 A1* | 2/2019 | Wada | ............... G06F 3/04164 |
| 2020/0064887 A1* | 2/2020 | Kim | ............... H01L 51/0097 |
| 2020/0076097 A1* | 3/2020 | Xu | .................. H05K 1/113 |
| 2020/0098842 A1* | 3/2020 | Jeon | ............... H01L 27/3276 |
| 2020/0286978 A1* | 9/2020 | Nishimura | ............. H01L 27/32 |

FOREIGN PATENT DOCUMENTS

| | | |
|---|---|---|
| KR | 10-2017-0071047 | 6/2017 |
| KR | 10-2017-0113757 | 10/2017 |
| KR | 10-1854695 | 4/2018 |

* cited by examiner

*Primary Examiner* — Long Pham
(74) *Attorney, Agent, or Firm* — Kile Park Reed & Houtteman PLLC

(57) ABSTRACT

A display apparatus includes a flexible substrate including a first area in which an image is displayed, a second area spaced apart from the first area, and a bending area between the first area and the second area, a first insulation layer on an upper surface of the flexible substrate in the bending area, a first source-drain pattern on the upper surface of the flexible substrate in the first area, and a signal line on the first insulation layer in the bending area, and a protecting pattern corresponding to the entire bending area, a first pattern film on a lower surface of the flexible substrate in the first area, a second pattern film spaced apart from the first pattern film, the second pattern film being on the lower surface of the flexible substrate in the second area, and a resin layer on a second source-drain pattern in the bending area.

20 Claims, 6 Drawing Sheets

DISPLAY APPARATUS

CROSS-REFERENCE TO RELATED APPLICATION

Korean Patent Application No. 10-2018-0113863, filed on Sep. 21, 2018, in the Korean Intellectual Property Office, and entitled: "Display Apparatus," is incorporated by reference herein in its entirety.

BACKGROUND

1. Field

Embodiments relate to a display apparatus. More particularly, exemplary embodiments relate to a display apparatus with reduced bezel which is non-display area.

2. Description of the Related Art

Recently, a display apparatus having light weight and small size has been manufactured. A cathode ray tube (CRT) display apparatus has been used due to a performance and a competitive price. However, the CRT display apparatus has a weakness with a size or portability. Therefore, a display apparatus such as a plasma display apparatus, a liquid crystal display apparatus and an organic light emitting display apparatus has been highly regarded due to small size, light weight and low-power-consumption.

SUMMARY

Embodiments are directed to a display apparatus including a flexible substrate including a first area in which an image is displayed, a second area spaced apart from the first area, and a bending area between the first area and the second area, a first insulation layer on an upper surface of the flexible substrate in the bending area, a first source-drain pattern including source and drain electrodes on the upper surface of the flexible substrate in the first area, and a signal line on the first insulation layer in the bending area, a second insulation layer on the first source-drain pattern, a second source-drain pattern including a contact pad on the second insulation layer in the first area, and a protecting pattern corresponding to the entire bending area, a first pattern film on a lower surface of the flexible substrate in the first area, a second pattern film spaced apart from the first pattern film, the second pattern film being on the lower surface of the flexible substrate in the second area, and a resin layer on the second source-drain pattern in the bending area.

A neutral plane in the bending area may be in the protecting pattern or may be on a side of the protection pattern that is opposite to the side of the protection pattern facing the signal line such that the protection pattern is between the signal line and the neutral plane. Compressive stress may act on the signal line when the flexible substrate is bent.

The display apparatus may further include a third insulation layer between the protecting pattern and the resin layer.

The first to third insulation layers may include an organic insulation material.

The resin layer may include an acryl resin.

The display apparatus may further include a pixel defining layer on the third insulation layer, the pixel defining layer defining an opening in the first area, and a light emitting structure in the opening. In the bending area, the pixel defining layer may be between the third insulation layer and the resin layer.

The flexible substrate may include first and second layers including polyimide and a barrier layer between the first layer and the second layer.

The neutral plane may be in the protecting layer.

The signal line may extend along a width direction of the bending area to connect the first area and the second area.

A ground voltage may be applied to the protecting pattern.

The display apparatus may further include an optical element in the first area. The resin layer may contact a side surface of the optical element.

The display apparatus may include a protecting layer on the optical element. The resin layer resin layer may contact a side surface of the protecting layer.

The display apparatus may further include a driving circuit part on the flexible substrate in the second area. A portion of the driving circuit part may be covered by the resin layer.

A stiffness of the first and second pattern films may be higher than a stiffness of the flexible substrate or the resin layer The flexible substrate in the bending area may be bent so that the first area and the second area overlap each other.

Embodiments are also directed to a display apparatus including a thin film panel including a first area in which an image is displayed, a second areas spaced apart from the first area, and a bending area between the first area and the second area, a first pattern film on a lower surface of the thin film panel, a second pattern film on the lower surface of the thin film panel in the second area and spaced apart from the first pattern film, and a resin later on the thin film panel in the bending area. In the bending area, the thin film panel includes a signal line, and a protecting pattern insulated from the signal line and corresponding to entire of the bending area.

The protecting pattern may be a metal layer.

A ground voltage may be applied to the protecting pattern.

A neutral plane in the bending area may be in the protecting pattern or on the protecting pattern opposite to the signal line with reference to the protecting pattern, so that a compressive stress acts on the signal line in the bending area when the thin film panel is bent.

The display apparatus may further include an optical element in the first area and a driving circuit part in the second area. The resin layer may contact a side surface of the optical element. A portion of the driving circuit part may be covered by the resin layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
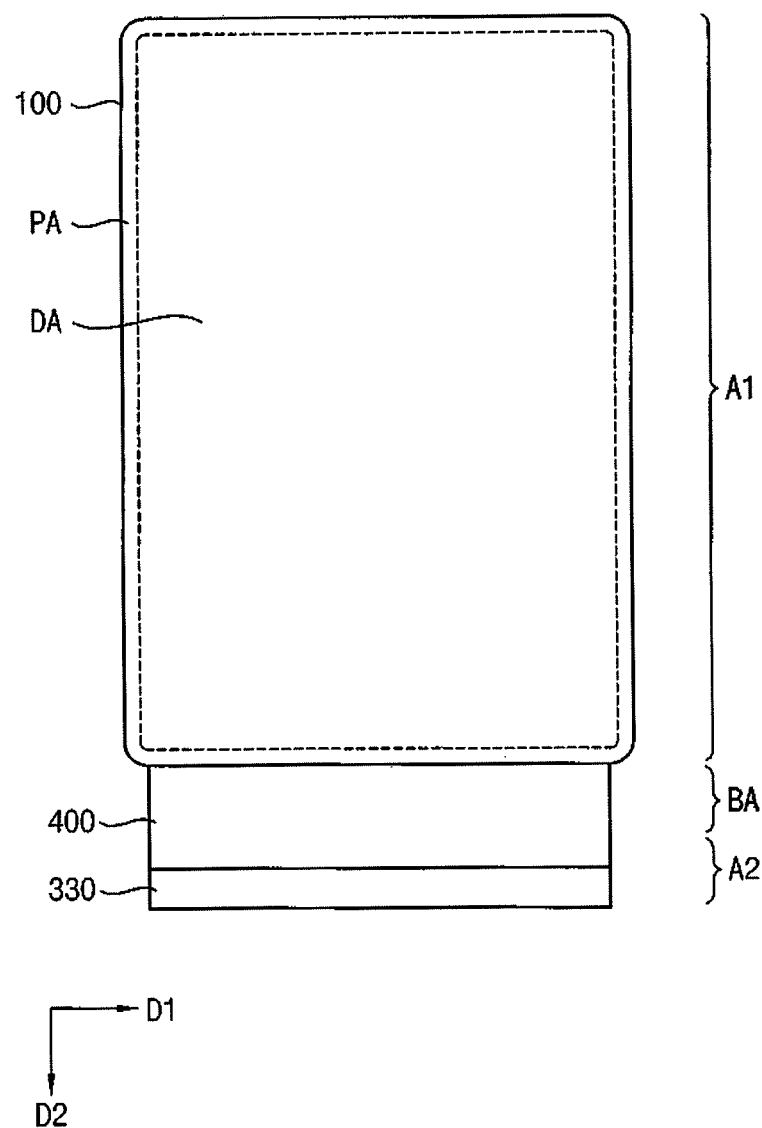
FIG. 1 illustrates a plan view of a display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a plan view illustrating a display apparatus according to an exemplary embodiment.

Referring to FIG. 1, the display apparatus may include a first area A1, a second area A2 spaced apart from the first area A1 and a bending area BA between the first area A1 and the second area A2. The first area A1 may include a display area DA in which an image is displayed and a peripheral area PA, which is a non-display area. The peripheral area may be disposed adjacent to and surrounding the display area.

The display area DA may be disposed on a plane formed by a first direction D1 and a second direction D2 crossing the first direction D1. The second area A2 may be spaced apart from the first area A1 in the second direction D2. A portion of the display apparatus corresponding to the bending area BA may be bent so that the second area A2 overlaps with the first area A1 (refer to FIG. 2B).

The display apparatus may include a plurality of pixels in the display area DA. The display apparatus may further include a driver disposed in a peripheral area PA, the bending area BA and the second area A2 for driving the pixels, and a wiring part connecting the pixel to the driver.

Each of the pixels may be provided as a minimum unit for displaying an image.

The pixels may include a display element that emits color light. For example, the display apparatus may be a liquid crystal display (LCD) device, an electrophoretic display device (EPD device), an electrowetting display device (EWD device) or an organic light emitting display device (OLED device). In the following, for convenience of explanation, the organic light emitting display apparatus will be described as an example of the display apparatus.

Each of the pixels may emit one of red, green, and blue colors. For example, each of the pixels may emit colors such as cyan, magenta, yellow, and white.

Figure 2A:
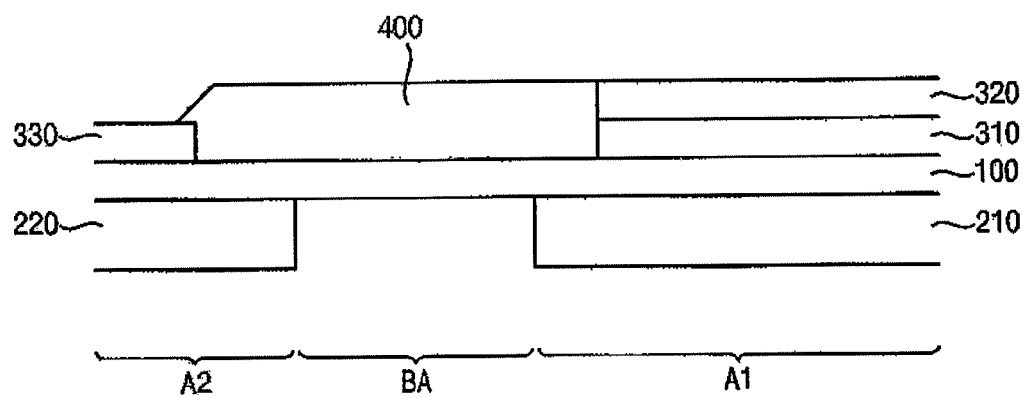
FIG. 2A illustrates a cross-sectional view of a bending portion of the display apparatus of FIG. 1.
Figure 2B:
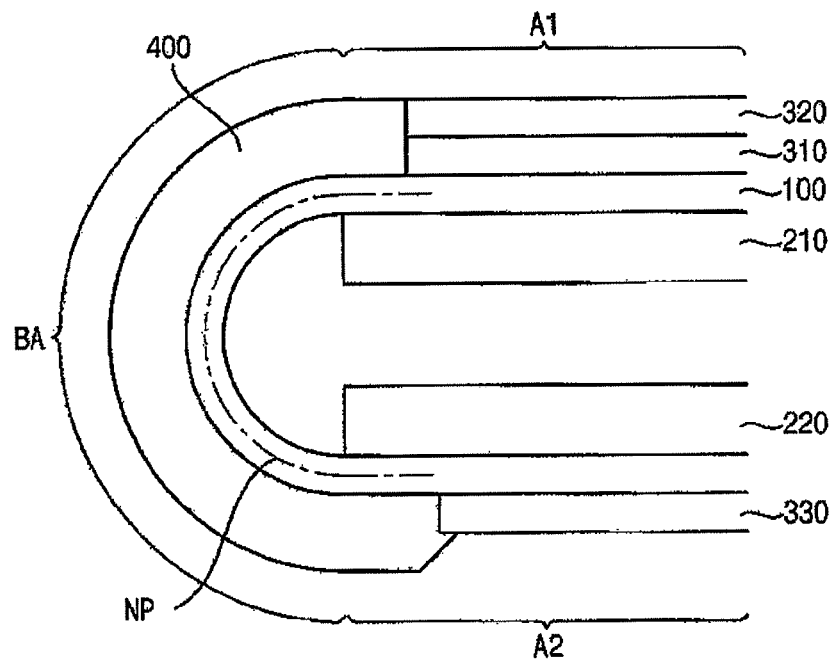
FIG. 2B illustrates a cross-sectional view of the display apparatus of FIG. 2A when the display apparatus is bent.

FIG. 2A illustrates a cross-sectional view of a bending portion of the display apparatus of FIG. 1. FIG. 2B illustrates a cross-sectional view of the display apparatus of FIG. 2A when the display apparatus is bent.

Referring to FIGS. 1, 2A and 2B, the display apparatus may include a thin film panel 100, an optical element 310, a protecting layer 320, a resin layer 400, a first pattern film 210, a second pattern film 210, and a driving circuit part 330.

The thin film panel 100 may be disposed over the first area A1, the bending area BA, and the second area A2. The thin film panel 100 may include a flexible substrate and a plurality of thin film structures formed on the flexible substrate. A portion of the thin film panel 100 corresponding to the bending area BA may be bendable. The detailed configuration of the thin film panel 100 will be described below in FIGS. 3 and 4.

The optical element 310 may be disposed on an upper surface of the thin film panel 100 in the first area A1. The optical element 310 may be an optical sheet such as a polarizer or an antireflection film.

The protecting layer 320 may be disposed on the optical element 310 to protect a front surface of the display apparatus from the outside.

The resin layer 400 may be disposed in the bending area BA on the upper surface of the thin film panel 100. The resin layer 400 may extend to a portion of the first area A1 adjacent to the bending area BA and to a portion of the second area A2. The resin layer 400 may be formed by applying a resin solution on the thin film panel 100 and UV-curing the resin layer. The resin layer 400 may include an acrylic resin.

The resin layer 400 may be a stress neutralizing layer for adjusting a position of the neutral plane NP. Such adjustment may adjust the position of the neutral plane NP so that tensile stress does not act on signal lines formed on the bending area BA of the thin film panel 100. For example, a signal line (refer to SL in FIGS. 4 and 5) connecting the first area A1 and the second area A2 of the thin film panel 100 for transmitting a signal may pass through the bending area BA. When tensile stress acts on the signal lines, cracks could to occur. In order to prevent the occurrence of cracks, the resin layer 400 may be formed so that the neutral plane NP moves toward the resin layer 400 so that compressive stress acts on the signal lines.

Here, the term "neutral plane NP" refers to a plane on which no compressive stress or tensile stress acts when bending the thin film panel 100 by bending the bending area BA. For example, when the bending area BA is bent as shown in FIG. 2B, compressive stress acts on inside of a curved curvature and tensile stress acts on outside of the curved curvature. Therefore, a direction of the stress is gradually changed from a compression direction to a tensile direction from the inside to the outside of the curvature. At a critical point, there is a transition point at which neither compressive stress nor tensile stress acts, and this point is referred to as the neutral plane NP.

The first pattern film 210 may be disposed on a lower surface of the thin film panel 100 in the first area A1. The first pattern film 210 may have an appropriate stiffness so that the first area A1 is not bent even if the bending area BA of the thin film panel 100 is bent. The first pattern film 210 may support the thin film panel 100 in the first area A1. The first pattern film 210 may be formed of a material such as a synthetic resin. For example, the first pattern film 210 may include PET (polyethylene terephthalate).

The second pattern film 220 may be disposed on the lower surface of the thin film panel 100 in the second area A2. The second pattern film 220 may have an appropriate stiffness so that the second area A2 is not bent even if the bending area BA of the thin film panel 100 is bent. The second pattern film 220 may support the thin film panel 100 in the second area A2. The second pattern film 220 may be formed of a material such as a synthetic resin. For example, the second pattern film 220 may include PET (polyethylene terephthalate).

The driving circuit part 330 may be disposed on the thin film panel 100 in the second area A2. The driving circuit part 330 may be a COF (chip on film) device including a driving circuit for driving the display apparatus and a flexible printed circuit board connecting the driving circuit to the thin film panel 100.

Figure 3:
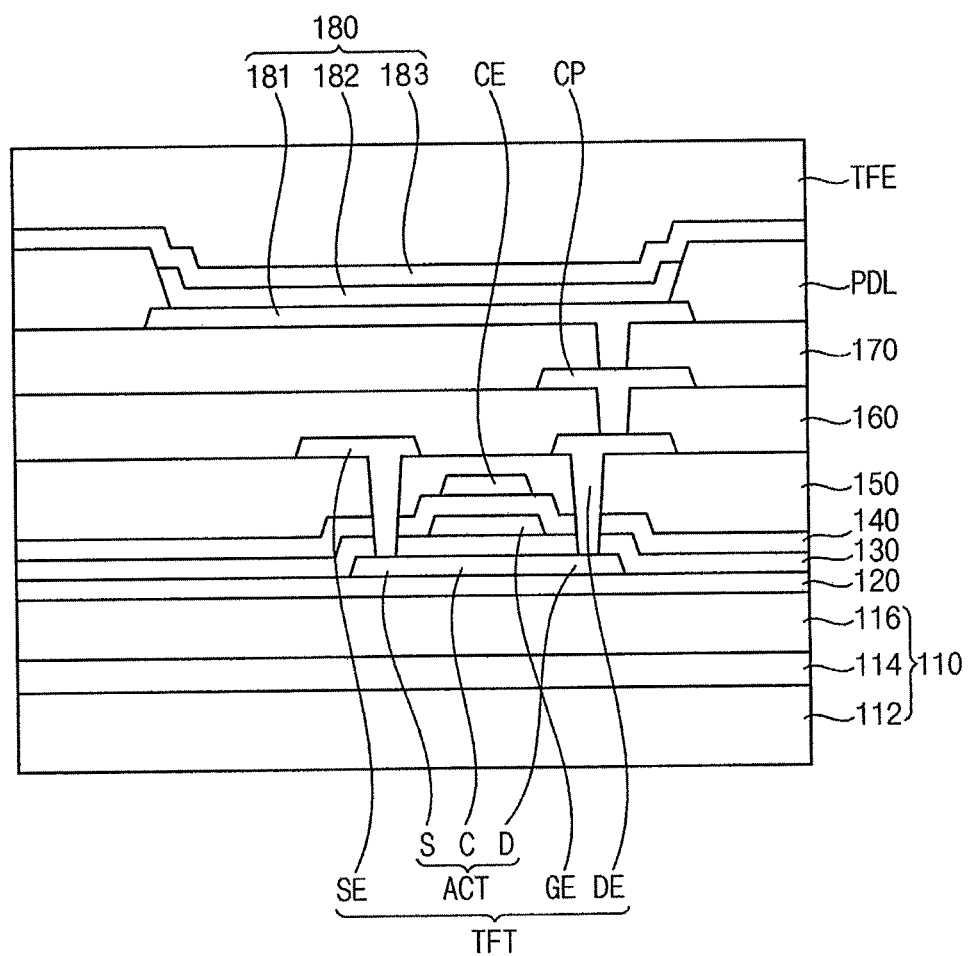
FIG. 3 illustrates a cross-sectional view of a portion of a display area of the display apparatus of FIG. 1.

FIG. 3 illustrates a cross-sectional view of a portion of a display area of the display apparatus of FIG. 1.

Referring to FIGS. 1 to 3, the display apparatus may include, in a stacking direction, a flexible substrate 110, a buffer layer 120, an active pattern ACT, a first gate insulation layer 130, a first gate pattern including a gate electrode GE, a second gate insulation layer 140, a second gate pattern including a storage electrode CE, an interlayer insulation layer 150, a first source-drain pattern including a source electrode SE and a drain electrode DE, a second insulation layer 160, a second source-drain pattern including a contact pad CP, a third insulation layer 170, a pixel defining layer PDL, a light emitting structure 180, and a thin film encapsulation layer TFE.

The flexible substrate 110 may include transparent or opaque insulation materials. For example, the flexible substrate 110 may include a flexible transparent material such as a flexible transparent resin substrate. The flexible substrate 110 may include, for example, a first layer 112, a barrier layer 114 disposed on the first layer 112, and a second layer 116 disposed on the barrier layer 114. The first and second layers 112 and 116 may be polyimide film layers. The barrier layer 114 may include a plurality of layers including amorphous silicon (a-Si), silicon oxide (SiOx) or the like.

The buffer layer 120 may be disposed on the flexible substrate 110. The buffer layer 120 may reduce or prevent the diffusion of metal atoms and/or impurities from the flexible substrate 110 into the active pattern ACT. In addition, the buffer layer 120 may control a rate of a heat transfer in a crystallization process for forming the active pattern ACT, thereby obtaining a substantially uniform active pattern ACT.

The active pattern ACT may be disposed on the buffer layer 110. The active pattern ACT may include amorphous silicon or polycrystalline silicon. In some example embodiment, the active pattern ACT may include oxide of at least one substance selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The active pattern ACT may include a source region S and a drain region D doped with an impurity, and a channel region C disposed between the source region S and the drain region D.

The first gate insulation layer 130 may be disposed on the buffer layer 120. The first gate insulation layer 130 may be uniformly formed on the buffer layer 120 along a profile of the active pattern ACT. The first gate insulation layer 130 may include a silicon compound, metal oxide, etc.

The first gate pattern may be disposed on the first gate insulation layer 130. The first gate pattern may include a gate electrode GE and a signal line such as a gate line. The first gate pattern may be formed using metal, alloy, metal nitride, conductive metal oxide, transparent conductive material, etc.

The second gate insulation layer 140 may be disposed on the first gate insulation layer 130 on which the first gate pattern is disposed. For example, the second gate insulation layer 130 may be uniformly formed on the first gate insulation layer 120 along a profile of the first gate pattern. The second gate insulation layer 130 may have a small thickness, such that a stepped portion may be formed at a portion of the second gate insulation layer 130 adjacent to the first gate pattern. The second gate insulation layer 130 may include a silicon compound, a metal oxide, or the like. The second gate insulation layer 130 may be formed of a plurality of layers.

The second gate pattern may be disposed on the second gate insulation layer 130.

The second gate pattern may include a storage electrode CE. The storage electrode CE may overlap the gate electrode GE in the stacking direction to form a storage capacitor. The second gate pattern may be formed using metal, alloy, metal nitride, conductive metal oxide, transparent conductive material, etc.

The interlayer insulation layer 150 may be disposed on the second gate insulation layer 140 on which the second gate pattern is disposed. For example, the interlayer insulation layer 150 may sufficiently cover the second gate pattern on the second gate insulation layer 140 and may have a substantially planar top surface without creating a step portion adjacent to the second gate pattern. The interlayer insulation layer 150 may include a silicon compound, a metal oxide, or the like. The interlayer insulation layer 150 may be formed of a plurality of layers.

The first source-drain pattern may be disposed on the interlayer insulation layer 150. The first source-drain pattern may include a source electrode SE, a drain electrode DE and a signal line such as a data line. The source electrode SE and the drain electrode DE may be electrically connected to the active pattern ACT through a contact hole formed through the interlayer insulation layer 150, the second gate insulation layer 140, and the first insulation layer 130. The first source-drain pattern may be formed using a metal, an alloy, a metal nitride, a conductive metal oxide, a transparent conductive material, etc. For example, the first source-drain pattern may be a laminated structure including a first layer including titanium (Ti), a second layer including aluminum (Al), and a third layer including titanium (Ti).

The gate electrode GE, the active pattern ACT, the source electrode SE and the drain electrode DE may be included in a thin film transistor TFT.

The second insulation layer 160 may be disposed on the interlayer insulation layer 150 on which the first data pattern is disposed. The second insulation layer 160 may have a single-layered structure or a multi-layered structure including at least two insulation films. The second insulation layer 160 may be formed using an organic material. For example, the second insulation layer 160 may include a photoresist, an acryl-based resin, a polyimide-based resin, a polyamide-based resin, a siloxane-based resin, etc.

The second source-drain pattern may be disposed on the second insulation layer 160. The second source-drain pattern may include a contact pad CP. The contact pad CP may be electrically connected to the drain electrode DE through a contact hole formed through the second insulation layer 160. The second source-drain pattern may be formed using metal, alloy, metal nitride, conductive metal oxide, transparent conductive material, etc.

The third insulation layer 170 may be disposed on the second insulation layer 160 on which the second data pattern is located. The third insulation layer 170 may have a single-layered structure or a multi-layered structure including at least two insulation films. The third insulation layer 170 may be formed using an organic material. For example, the third insulation layer 170 may include photoresist, acryl-based resin, polyimide-based resin, polyamide-based resin, siloxane-based resin, etc.

The light emitting structure 180 may include a first electrode 181, an emission layer 182 and a second electrode 183.

The first electrode 181 may be disposed on the third insulation layer 170. The first electrode 181 may include a reflective material or a transmissive material in accordance with the emission type of the display apparatus. For example, the first electrode 181 may be formed using aluminum, an alloy containing aluminum, aluminum nitride, silver, an alloy containing silver, tungsten, tungsten nitride, copper, an alloy containing copper, nickel, an alloy containing nickel, chromium, chromium nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the first electrode 181 may have a single layer structure or a multi layer structure, which may include a metal film, an alloy film, a metal nitride film, a conductive metal oxide film and/or a transparent conductive film.

The pixel defining layer PDL may be disposed on the third insulation layer 170 on which the first electrode 181 is located. The pixel defining layer PDL may be formed using an organic material. For example, the pixel defining layer PDL may include a photoresist, an acryl-based resin, a polyimide-based resin, a polyamide-based resin, a siloxane-based resin, etc. In some example embodiments, an opening that exposes the first electrode 181 may be formed by etching the pixel defining layer PDL. An emitting area and a non-emitting area of the display apparatus may be defined by the opening of the pixel defining layer PDL. For example, a portion where the opening of the pixel defining layer PDL is located may correspond to the emitting area, and the non-emitting area may correspond to a portion adjacent to the opening of the pixel defining layer PDL.

The light emitting layer 182 may be disposed on the first electrode 181 exposed through the opening of the pixel defining layer PDL. In addition, the light emitting layer 182 may extend onto a sidewall of the opening of the pixel defining layer PDL. In some example embodiments, the light emitting layer 182 may include an organic light emitting layer (EL), a hole injection layer (HIL), a hole transfer layer (HTL), an electron transfer layer (ETL), an electron injection layer (EIL), etc. In some example embodiments, the hole injection layer, the hole transport layer, the electron transport layer, and the electron injection layer may be formed in common to correspond to a plurality of pixels. In some example embodiments, a plurality of organic light emitting layers may be formed using light emitting materials for generating different colors of light such as a red color of light, a green color of light and a blue color of light in accordance with color pixels of the display device. In some example embodiments, the organic light emitting layer of the of the light emitting layer 182 may include a plurality of stacked light emitting materials for generating a red color of light, a green color of light and a blue color of light to thereby emitting a white color of light. Elements of the light emitting layer 182 are commonly formed so as to correspond to a plurality of pixels, and each pixel can be divided by a color filter layer.

The second electrode 183 may be disposed on the pixel defining layer PDL and the light emitting layer 182. The second electrode 183 may include a transmissive material or a reflective material in accordance with the emission type of the display device. For example, the second electrode 183 may be formed using aluminum, an alloy containing aluminum, aluminum nitride, a silver, alloy containing silver, tungsten, tungsten nitride, copper, an alloy containing copper, nickel, an alloy containing nickel, chromium, chromium nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the second electrode 183 may have a single layer structure or a multi layer structure, which may include a metal film, an alloy film, a metal nitride film, a conductive metal oxide film and/or a transparent conductive film.

The thin film encapsulation layer TFE may be disposed on the second electrode 183. The thin film encapsulation layer TFE may reduce or prevent penetration of moisture and oxygen from outside. The thin film encapsulation layer TFE may include at least one organic layer and at least one inorganic layer alternately stacked.

Figure 4:
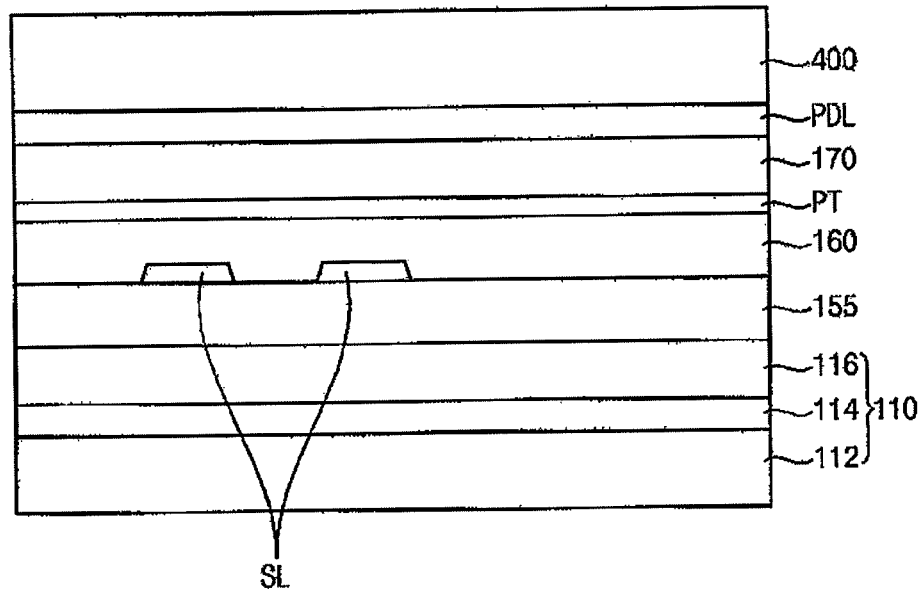
FIG. 4 illustrates a cross-sectional view of a portion of a bending area of the display apparatus of FIG. 1.
Figure 5:
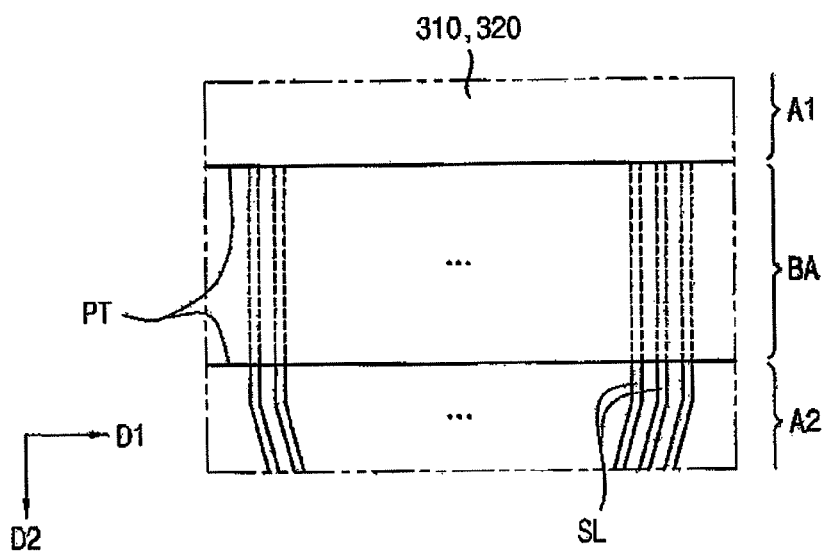
FIG. 5 illustrates a plan view of a portion of a bending area of the display apparatus of FIG. 1.

FIG. 4 illustrates a cross-sectional view of a portion of a bending area of the display apparatus of FIG. 1. FIG. 5 illustrates a plan view of a portion of a bending area of the display apparatus of FIG. 1.

Referring to FIGS. 1 to 5, the display apparatus may further include a first insulation layer 155, a plurality of signal lines SL and protecting pattern PT.

The first insulation layer 155 may be disposed between the flexible substrate 110 and the second insulation layer 160. The first insulation layer 155 may be formed directly on the flexible substrate 110 from which the buffer layer 120, the first and second gate insulation layers 130 and 140 and the interlayer insulation layer 150 are removed or absent from the bending area BA. In this regard, the layers that are removed or omitted from the bending area BA may contain an inorganic insulating material and are susceptible to breakage when the bending area BA is bent.

The first insulation layer 155 may reduce a step in the bending area BA formed by the removal or absence of the buffer layer 120, the first and second gate insulating layers 130 and 140 and the interlayer insulation layer 150. The first insulation layer 155 may include an insulation material that is not be susceptible to damage when the bending area BA is folded. In some implementations, the first insulation layer 155 may include an inorganic material.

The first insulation layer 155 may have a single-layered structure or a multi-layered structure including at least two insulation films. In some implementations, the first insulation layer 155 may be formed using an organic material. For example, the first insulation layer 155 may include a photoresist, an acryl-based resin, a polyimide-based resin, a polyamide-based resin, a siloxane-based resin, etc.

The first source-drain pattern may be disposed on the first insulation layer 155. The first source-drain pattern may include a plurality of signal lines SL. Referring to FIG. 5, the signal lines SL may extend in the second direction D2 in the bending area BA and may connect the first area A1 and the second area A2 to each other to transmit a signal provided from the driving circuit part 330 to the display area DA of the first area A1.

The second insulation layer 160 may be disposed on the first insulation layer 155 on which the signal lines SL are located.

The second source-drain pattern may be disposed on the second insulation layer 160. The second source-drain pattern may further include a protecting pattern PT. The protecting pattern PT may be formed to overlap the entire bending area BA in the stacking direction. The protecting pattern PT may be formed in a plate shape in the bending area BA so that a position of the neutral plane NP moves toward the resin layer 400, as compared to the case where the protecting pattern PT is not formed. Accordingly, it may be possible to prevent tensile stress from acting on the signal line SL even if thickness of the resin layer 400 were to be made thinner. Thus, thickness of the display apparatus in the bending area BA may be reduced. Therefore, the radius of curvature of the bending area BA may be reduced, workability in the manufacturing process can be improved, the thickness of the display apparatus can be reduced, and the width of the bezel may be reduced.

The neutral plane NP may be formed in or on the protecting pattern PT. For example, the neutral plane NP may be formed in the protecting pattern PT, the third insulating layer 170, the pixel defining layer PDL, or the resin layer 400. For example, the neutral plane NP may be formed in the protecting pattern PT to minimize the thickness of the resin layer 400 while preventing tensile stress from acting on the signal line SL. In some implementations, the neutral plane may be formed on a side of the protection pattern that is opposite to the side of the protection pattern facing the signal line such that the protection pattern is between the signal line and the neutral plane The protecting pattern PT may be formed of a metal to improve the strength of the thin film panel 100 in the bending area BA.

A ground voltage may be applied to the protecting pattern PT. When a ground voltage is applied to the protecting pattern PT, it may possible to prevent an external influence on the signal line SL (shielding effect), thereby improving the display quality. For example, the signal line SL may be shielded by the protecting pattern PT from the influence of an external electromagnetic force or signal of a touch screen.

The third insulation layer 170 may be disposed on the protecting pattern PT. The pixel defining layer PDL may be disposed on the third insulation layer 170. The resin layer 400 may be disposed on the pixel defining layer PDL.

Figure 6:
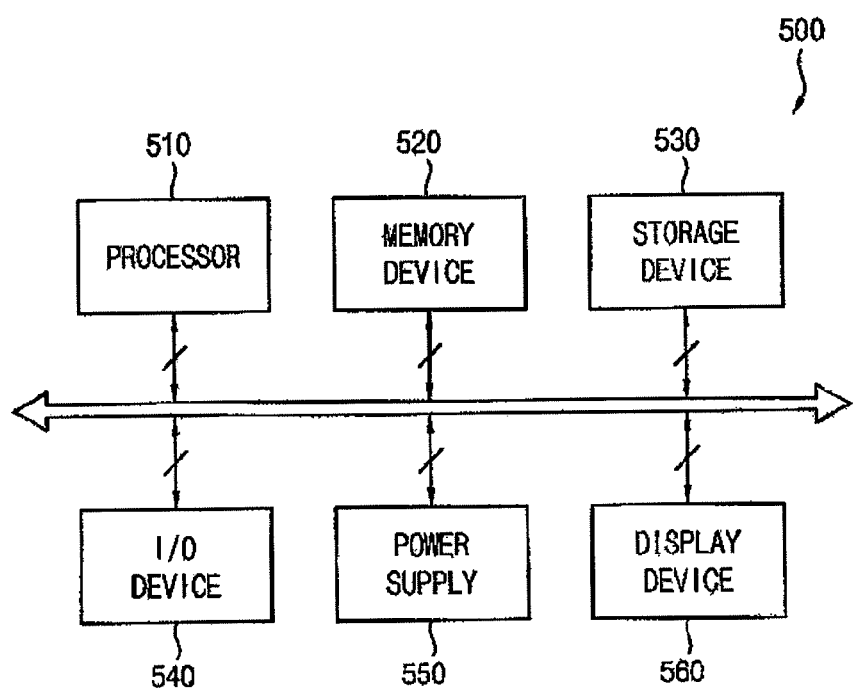
FIG. 6 illustrates a block diagram of an electronic device according to example embodiments.
Figure 7A:
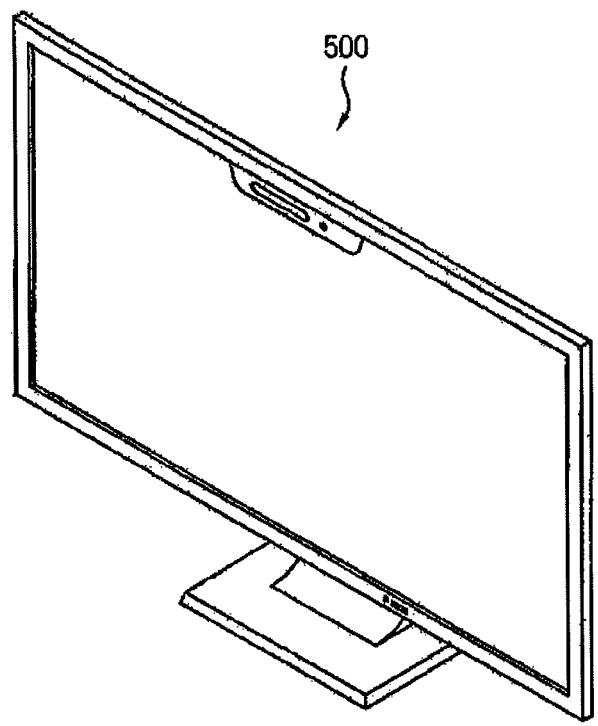
FIG. 7A illustrates a diagram of an example in which the electronic device of FIG. 6 is implemented as a television.
Figure 7B:
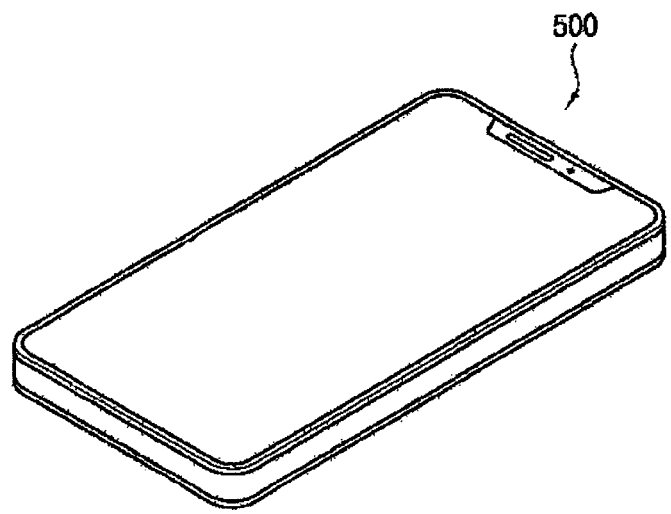
FIG. 7B illustrates a diagram of an example in which the electronic device of FIG. 6 is implemented as a smart phone.

FIG. 6 illustrates a block diagram of an electronic device according to example embodiments. FIG. 7A illustrates an example in which the electronic device of FIG. 6 is implemented as a television. FIG. 7B illustrates an example in which the electronic device of FIG. 6 is implemented as a smart phone.

Referring to FIGS. 6 through 7B, the electronic device 500 may include a processor 510, a memory device 520, a storage device 530, an input/output (I/O) device 540, a power supply 550, and a display device 560. The display device 560 may correspond to the display apparatus of FIG. 1. The electronic device 500 may further include a plurality of ports for communicating with a video card, a sound card, a memory card, a universal serial bus (USB) device, other electronic devices, etc. In an example embodiment, as illustrated in FIG. 7A, the electronic device 500 may be a television. In another example embodiment, as illustrated in FIG. 7B, the electronic device 500 may be a smart phone. In some implementations, the electronic device 500 may be, for example, a cellular phone, a video phone, a smart pad, a smart watch, a tablet PC, a car navigation system, a computer monitor, a laptop, a head mounted display (HMD), etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen etc and an output device such as a printer, a speaker, etc. The power supply 550 may provide power for operations of the electronic device 500.

The display device 560 may be coupled to other components via the buses or other communication links. In some example embodiments, the display device 560 may be included in the I/O device 540. As described above, the display device 560 may include a flexible substrate including a bending area, and further include a signal line in the bending area and a protecting pattern formed corresponding to the entirety of the bending area. The signal line can be prevented from being damaged by tensile stress, the thickness of the display device can be reduced, the width of the bezel can be reduced, the workability in the manufacturing process can be improved, and the signal line can be shielded from external electromagnetic effects, as described above.

By way of summation and review, a structure in which a portion of a display apparatus is bent has been proposed for reducing the size of a non-display area such as a bezel surrounding a display area of the display apparatus.

Embodiments provide a display apparatus capable of reducing a risk of breakage of a bending area or bending portion, and reducing the size of the bezel in the non-display area A neutral plane may be formed in a bending area within a protecting pattern or on a protecting pattern opposite to a signal line, with reference to the protecting pattern. Accordingly, a compressive stress may act on the signal line in the bending area when the thin film panel is bent. Rigidity of the bending area can be improved while the thickness of a resin layer in the bending area is reduced Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display apparatus, comprising:
    a flexible substrate including a first area in which an image is displayed, a second area spaced apart from the first area, and a bending area between the first area and the second area;
    a first insulation layer on an upper surface of the flexible substrate in the bending area;
    a first source-drain pattern including source and drain electrodes on the upper surface of the flexible substrate in the first area, and a signal line on the first insulation layer in the bending area;
    a second insulation layer on the first source-drain pattern;
    a second source-drain pattern including a contact pad on the second insulation layer in the first area, and a protecting pattern corresponding to the entire bending area;
    a first pattern film on a lower surface of the flexible substrate in the first area;
    a second pattern film spaced apart from the first pattern film, the second pattern film being on the lower surface of the flexible substrate in the second area; and
    a resin layer on the protecting pattern in the bending area.

2. The display apparatus as claimed in claim 1, wherein:
    a neutral plane in the bending area is in the protecting pattern, or on a side of the protecting pattern that is opposite to the side of the protecting pattern facing the signal line so that the protecting pattern is between the signal line and the neutral plane, and
    compressive stress acts on the signal line when the flexible substrate is bent.

3. The display apparatus as claimed in claim 2, further comprising a third insulation layer between the protecting pattern and the resin layer.

4. The display apparatus as claimed in claim 3, wherein the first to third insulation layers include an organic insulation material.

5. The display apparatus as claimed in claim 4, wherein the resin layer includes an acryl resin.

6. The display apparatus as claimed in claim 3, further comprising:
    a pixel defining layer on the third insulation layer, the pixel defining layer defining an opening in the first area; and
    a light emitting structure in the opening,
    wherein the pixel defining layer is between the third insulation layer and the resin layer in the bending area.

7. The display apparatus as claimed in claim 2, wherein the flexible substrate includes:
    first and second layers including polyimide; and
    a barrier layer between the first layer and the second layer.

8. The display apparatus as claimed in claim 2, wherein the neutral plane is in the protecting pattern.

9. The display apparatus as claimed in claim 1, wherein the signal line extends along a width direction of the bending area to connect the first area and the second area.

10. The display apparatus as claimed in claim 9, wherein a ground voltage is applied to the protecting pattern.

11. The display apparatus as claimed in claim 1, further comprising an optical element in the first area, wherein the resin layer contacts a side surface of the optical element.

12. The display apparatus as claimed in claim 11, further comprising a protecting layer on the optical element,
    wherein the resin layer contacts a side surface of the protecting layer.

13. The display apparatus as claimed in claim 1, further comprising a driving circuit part on the flexible substrate in the second area, wherein a portion of the driving circuit part is covered by the resin layer.

14. The display apparatus as claimed in claim 1, wherein a stiffness of the first and second pattern films is higher than a stiffness of the flexible substrate or the resin layer.

15. The display apparatus as claimed in claim 1, wherein the flexible substrate in the bending area is bent so that the first area and the second area overlap each other.

16. A display apparatus, comprising:
    a thin film panel including a first area in which an image is displayed, a second area spaced apart from the first area, and a bending area between the first area and the second area;
    a first pattern film on a lower surface of the thin film panel;
    a second pattern film on the lower surface of the thin film panel in the second area and spaced apart from the first pattern film; and
    a resin layer on the thin film panel in the bending area,
    wherein the thin film panel includes a signal line, and a metal protecting pattern insulated from the signal line and corresponding to the entire bending area.

17. The display apparatus as claimed in claim 16, wherein the metal protecting pattern is a metal layer.

18. The display apparatus as claimed in claim 17, wherein a ground voltage is applied to the metal protecting pattern.

19. The display apparatus as claimed in claim 17, wherein a neutral plane is in the bending area in the metal protecting pattern or on the metal protecting pattern opposite to the signal line with reference to the metal protecting pattern, so that a compressive stress acts on the signal line in the bending area when the thin film panel is bent.

20. The display apparatus as claimed in claim 16, further comprising:
    an optical element in the first area; and
    a driving circuit part in the second area, and
    wherein the resin layer contacts a side surface of the optical element, and
    a portion of the driving circuit part is covered by the resin layer.

* * * * *